United States Patent
White et al.

(10) Patent No.: US 8,941,077 B2
(45) Date of Patent: Jan. 27, 2015

(54) DECELERATION APPARATUS FOR RIBBON AND SPOT BEAMS

(75) Inventors: Nicholas White, Manchester, MA (US); Zhimin Wan, Sunnyvale, CA (US); Erik Collart, North Andover, MA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 0 days.

(21) Appl. No.: 13/280,162

(22) Filed: Oct. 24, 2011

(65) Prior Publication Data

US 2012/0097861 A1 Apr. 26, 2012

Related U.S. Application Data

(60) Provisional application No. 61/405,878, filed on Oct. 22, 2010.

(51) Int. Cl.
*H01J 1/88* (2006.01)
*H01J 3/26* (2006.01)
*H01J 3/04* (2006.01)
*H01J 37/317* (2006.01)

(52) U.S. Cl.
CPC ... *H01J 3/04* (2013.01); *H01J 3/26* (2013.01); *H01J 37/3171* (2013.01); *H01J 2237/04756* (2013.01); *H01J 2237/053* (2013.01)
USPC ........................................ 250/396 R; 250/398

(58) Field of Classification Search
CPC .............. H01J 2237/04735; H01J 2237/04756
USPC ................. 250/492.21, 492.1, 492.2, 492.23, 250/492.3, 396 R, 398
See application file for complete search history.

(56) References Cited

U.S. PATENT DOCUMENTS

| | | | | |
|---|---|---|---|---|
| 3,838,305 | A * | 9/1974 | Seliger et al. | 313/237 |
| 5,151,605 | A * | 9/1992 | Politiek et al. | 250/492.2 |
| 5,177,366 | A * | 1/1993 | King et al. | 250/492.2 |
| 5,373,164 | A * | 12/1994 | Benveniste | 250/492.21 |
| 5,693,939 | A * | 12/1997 | Purser | 250/251 |
| 5,756,993 | A * | 5/1998 | Yoshinari et al. | 250/281 |
| 5,780,863 | A * | 7/1998 | Benveniste et al. | 250/492.21 |
| 6,441,382 | B1 * | 8/2002 | Huang | 250/492.21 |
| 6,777,696 | B1 * | 8/2004 | Rathmell et al. | 250/492.21 |
| 7,233,008 | B1 * | 6/2007 | Petrov et al. | 250/396 ML |
| 7,247,846 | B2 * | 7/2007 | Buttrill, Jr. | 250/396 R |
| 7,675,047 | B2 * | 3/2010 | Radovanov et al. | 250/492.21 |
| 7,902,527 | B2 | 3/2011 | Chen et al. | |
| 2004/0227074 | A1 * | 11/2004 | Benveniste et al. | 250/492.21 |
| 2008/0258074 | A1 * | 10/2008 | Tsukihara et al. | 250/396 R |
| 2009/0101834 | A1 * | 4/2009 | Spraggon et al. | 250/423 R |
| 2009/0256082 | A1 * | 10/2009 | Nakashima | 250/396 R |
| 2009/0314962 | A1 * | 12/2009 | Dorai et al. | 250/492.21 |
| 2011/0084220 | A1 * | 4/2011 | Koning et al. | 250/492.3 |
| 2012/0001087 | A1 * | 1/2012 | Radovanov et al. | 250/396 R |

* cited by examiner

*Primary Examiner* — Brooke Purinton
(74) *Attorney, Agent, or Firm* — Morrison & Foerster LLP

(57) ABSTRACT

A deceleration apparatus capable of decelerating a short spot beam or a tall ribbon beam is disclosed. In either case, effects tending to degrade the shape of the beam profile are controlled. Caps to shield the ion beam from external potentials are provided. Electrodes whose position and potentials are adjustable are provided, on opposite sides of the beam, to ensure that the shape of the decelerating and deflecting electric fields does not significantly deviate from the optimum shape, even in the presence of the significant space-charge of high current low-energy beams of heavy ions.

14 Claims, 13 Drawing Sheets

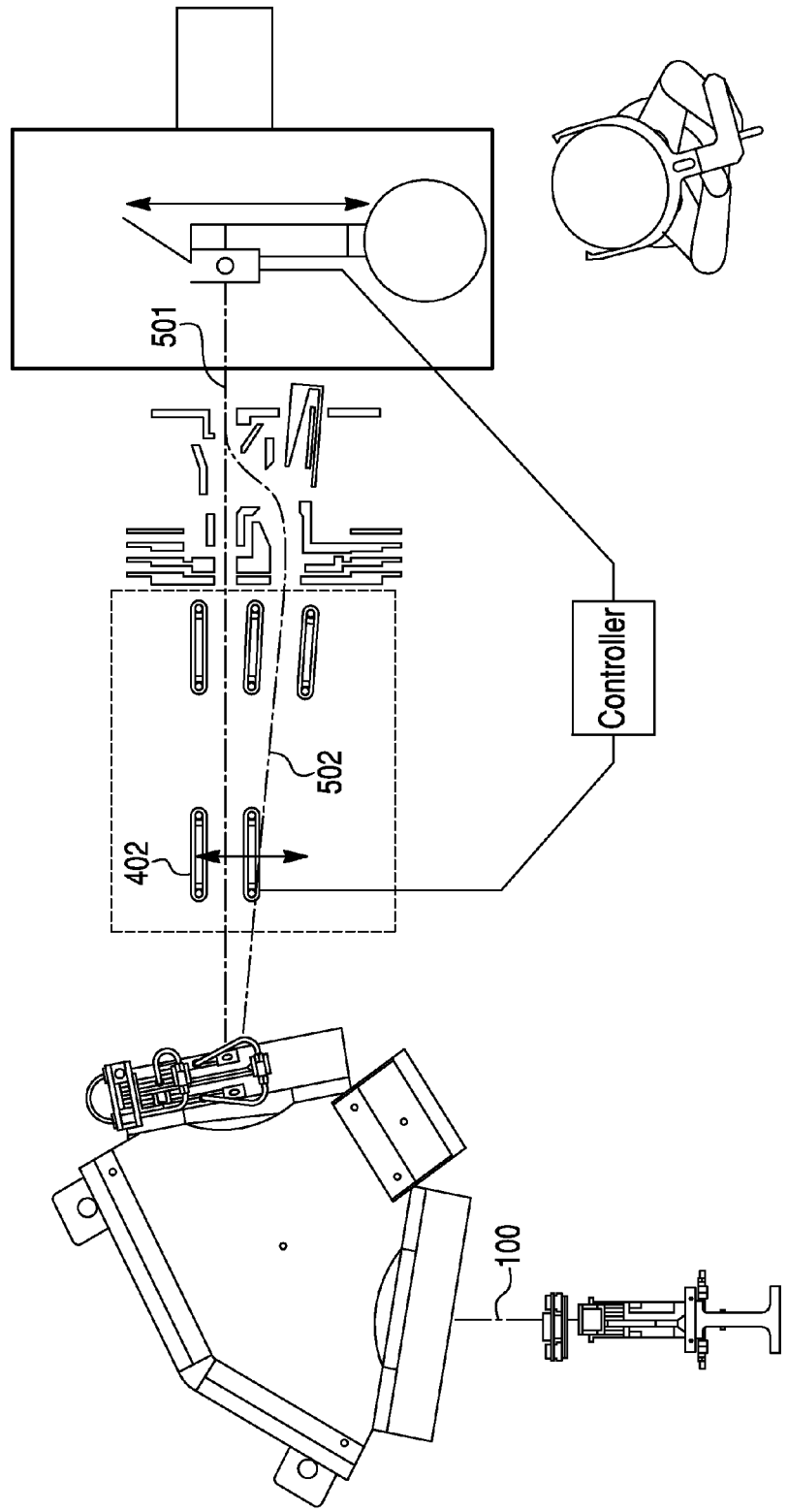

(side view with equipotentials and beam of prior art chicane)

DECELERATION APPARATUS FOR RIBBON AND SPOT BEAMS

CROSS-REFERENCE TO RELATED APPLICATIONS

This application claims the benefit of U.S. Provisional Application No. 61/405,878, filed on Oct. 22, 2010 and entitled DECELERATION CHAMBER FOR RIBBON AND SPOT BEAMS, the entire contents of which are hereby incorporated by reference.

BACKGROUND OF THE INVENTION

1. Field of the Invention

The invention is concerned generally with a deceleration apparatus capable of filtering out neutral particles, and more particularly, a deceleration apparatus capable of producing either a short spot beam or a tall ribbon beam with good beam angle control and smooth profiles.

2. Description of Related Art

Ion implantation is a process used to introduce into a target substrate atoms or molecules, generally referred to as dopants, to make materials with useful properties. Of particular interest, ion implantation is a common process used in making modern integrated circuits. Recently, interest has focused on generating ribbon beams of over 300 mm in size containing milliampere currents of ions at energies as low as 200 eV.

The highest beam currents are obtained by decelerating the ion beam immediately prior to the target; however, this practice has several known disadvantages. One disadvantage is that the deceleration tends to modify the trajectories, magnifying any angular errors and making control of uniformity in a ribbon beam more difficult. Another disadvantage is that a portion of the ions is neutralized by charge-exchange processes with residual gas atoms and molecules and, as a result, is not decelerated. These ions penetrate into the silicon much further than is intended, and this deep penetration of some of the dopant ions interferes with the intended process; furthermore, since neutralization depends on system pressure within the vacuum system, it is difficult to maintain constant conditions from day to day, and the level of contamination is not sufficiently constant to be tolerated.

Many recent innovations to ribbon-beam implanting systems are discussed or disclosed in U.S. Pat. No. 7,902,527, which is incorporated herein by reference. Key content of this patent is summarized below.

Some implanters use a lens to halt the divergence of the ion beam on reaching the requisite major dimensional size, and to collimate it, i.e. render it parallel. A suitable lens may use magnetic or electric fields, may generate a quadrupole field, and must have a beam passage of high aspect ratio to conform generally to the ribbon shape of the ion beam.

In certain circumstances such as when using high-current low energy beams it may not be possible to reliably deliver a ribbon beam that is sufficiently uniform, so the '527 patent discloses a two-mode implantation system. This comprises two multipole lenses after the analyzing magnet. In a first mode, the currents in the coils of one multipole lens can be controlled responsive to a measurement of the ion beam profile to control the current density in this beam profile. The ion beam is allowed to continue as a ribbon-shaped beam whose major dimension exceeds a dimension of the workpiece. The workpiece is then translated through this ion beam along a single path, one or more times, to implant a desired uniform dose of ions into its surface. In a second mode, the currents in the coils of a first multipole lens are excited so as to generate a quadrupole magnetic field which causes the ribbon ion beam to converge in its major dimension, thereby generating at a downstream location a beam spot which is smaller in both dimensions than either dimension of the workpiece—referred to hereinafter as a 'spot beam'. The workpiece is then translated in a reciprocating path in two dimensions through the ion beam, so as to implant a uniform dose of ions into its surface by implanting a succession of partially overlapping stripes. This is referred to as two-dimensional scanning.

It is generally desirable to minimize the number of passes required in order to achieve a specified dose uniformity. Commonly a standard deviation of 1% or less of the overall dose is an acceptable uniformity. The uniformity achievable depends upon the shape of the ion beam, specifically in its projection in the direction of the striping, or the 'slow scan direction'. The profile of the beam needs to be a smooth 'bell curve'. If it contains spikes or valleys in the profile, these will cause an increase in non-uniformity, which can be offset by a large increase in the number of stripes. However, increasing the number of beam passes will decrease the throughput, so is less economically viable.

The second mode is likely to be advantageous when using high-current, low-energy beams (for example greater than 1 mA at energies below 3 keV), under which conditions space-charge and other effects make positive control of the uniformity of the current in a beam more difficult. The first mode requires slower motions and is likely to deliver higher processing throughput at energies where satisfactory control of the ion beam profile can be achieved. The currents in the multipole lens in either mode may be adjusted to fine-tune the beam current density profile of the beam, even though at low energy this control is insufficient to ensure a uniform implant in one pass with a ribbon beam. In the second mode, this may be valuable to generate a bell-curve profile.

The '527 patent further discloses a second lens after the first multipole lens, whose function is to collimate the ion beam. This is particularly important for the first operating mode, i.e. the ribbon-beam case, where systematic variation in the implant angle across the face of the workpiece would otherwise occur. It is also of value to reduce the range of angular variation in the ion beam in the second mode.

The '527 patent further discloses optional means of deceleration or acceleration of the ion beam using a bent ion beam path, to deliver high beam currents at low energies while filtering out contaminants with the wrong energy, for use in ion implantation in either the ribbon-beam or 2D scan beam modes. The beam is bent through an angle that differs by a small amount from standard conditions, then the ion beam is decelerated by means of a set of electrodes that superimpose two opposed successive sideways components of electric field on the deceleration field, so that the ion beam is deflected in an s-shaped bend, the deflections each amounting to an angle of at least 10 degrees, and providing a lateral displacement of several times the width of the ion beam, returning it to its original path. By providing beam stops on either side of the beam, the only ions transmitted are those with the correct charge and energy, so contaminants with the wrong energy or charge can be removed. Such contaminants include neutral atoms formed from beam ions by charge exchange with the residual gas, and since the cross-sections for some charge-exchange reactions peak at beam energies below 1 keV, this becomes very important. This deceleration means has been described as a 'chicane' deceleration scheme.

BACKGROUND TO THE INVENTION

When decelerating a ribbon beam, it is very important that no component of electric field appear in the direction of the major transverse axis of the ribbon beam. Existing systems use electrodes with planar symmetry, i.e. a shape which could be drawn on a plane in which the s-shaped trajectory of an ion should lie, and which is then extruded along the direction of the major dimension of the cross section of the ion beam. Unfortunately it has been found that such transverse field components can still appear, for a variety of reasons which include:

a) The ribbon-shaped beam may be limited in size by passing it through a rectangular aperture. If this aperture is too close to the strong fields in the deceleration system, it modifies the shape of the fields near the beam extremities, causing unwanted beam deflection.

b) The electrode shapes are conceived as extrusions, but they are finite in extent, and the fields will be perturbed at their ends. Typically the electrodes must stop at a point within a metallic vacuum chamber at a defined electrical potential, such as ground potential. This creates strong local electric fields which may penetrate some distance inside the region the beam may occupy, disturbing the electric field at the beam edges.

c) The effects of the beam space-charge modify the potential distribution, and it would be desirable to confine these effects to the generation of fields in the direction of the minor beam dimension, to cause them to vary linearly with position across the beam profile, or to eliminate them altogether. Otherwise these fields tend to cause very non-linear defocusing at the edges of the ion beam, leading to a lowering of ribbon beam uniformity, and a loss of otherwise usable beam current. For a spot beam, the effects will be stronger and therefore more harmful. It would be desirable to maintain or enhance the smoothness of the projection of the beam current density so as to deliver a beam spot with a 'bell-curve' profile in the same direction as the major dimension of the ribbon beam.

The present invention is an improvement to earlier equipment and methods used to decelerate ions through a 'chicane' deceleration system, or indeed other similar deceleration or acceleration systems, mitigating the effects which can adversely affect the transport of an ion beam, either spot-shaped or ribbon-shaped, through these systems. It addresses the need to provide a uniform, high current ribbon beam, or alternatively, a spot beam with a smoothly varying current-density profile.

SUMMARY OF THE INVENTION

The present invention involves an assembly of prism-shaped electrodes between which an ion beam is passed, undergoing deflection and deceleration as a result of potentials applied to the electrodes. A number of factors can distort the shape of the equipotentials and the electric fields.

One aspect of the present invention is to provide conducting electrode caps mounted to and connected to at least some of the prism-shaped electrodes, which substantially close the gap at the ends of the electrodes, leaving only a sufficient gap safely to withstand the potential difference between the electrodes, but substantially shielding the beam from the chamber potential.

Another aspect of the present invention consists of widening the gaps between the electrode caps described above, and providing a further pair of electrodes, one each in the gap at the ends of the prism-shaped electrodes and between the caps, and applying an intermediate potential, thereby greatly reducing the magnitude and extent of non-uniformity of the electric field caused by the cap electrodes themselves.

Another aspect of the present invention is to control the intermediate potential applied to said further pair of electrodes, responsive to the level of space-charge in the beam, so as to mitigate the tendency of space-charge blowup to occur along the direction of the axis of the prism-shaped electrodes, and to provide some control of the current density of the beam. The current density can be measured by well-known techniques such as a traveling Faraday cup.

Another aspect of the present invention is to provide a means of moving said further pair of electrodes closer to or further from the ion beam passing between them, to allow control of space-charge blowup and of the beam size, applicable to ion beams of different sizes.

Another aspect of the invention is an improvement to a deceleration apparatus for deflecting an ion beam and decelerating it from a first energy to a second energy. The apparatus will not decelerate neutral atoms, nor will it deflect them, and it will deflect ions with an incorrect energy through a significantly different angle, thus allowing unwanted ions and neutral atoms to be intercepted and removed from the beam. The faces of the electrodes which are close to the ion beam are of prismatic form, extended in the direction which is orthogonal to the beam travel direction, and also to the direction in which the beam is deflected. The ions may be deflected twice, in opposite directions.

The improvement consists of providing additional symmetrical shaped electrodes, in locations beyond the limits of the ion beam and on opposite sides of the beam mid-plane in which ions are deflected. Controlled potentials are applied to these electrodes. The electrodes are movable in the direction directed toward the beam axis, and may be moved to selected positions a desired distance from the edges of the beam. These electrodes affect the shape of the electric fields, and by adjusting the potentials and positions on these electrodes, they may be effective to mitigate any disturbance to the shape of the electric fields due to the presence of grounded chamber walls or other conductive items near the deceleration system, or from space-charge forces caused by the beam itself. Thereby the uniformity of a ribbon beam being decelerated by be preserved or improved. Alternatively, the smoothness of the current-density profile of a spot beam may be preserved or improved.

Another aspect of the invention is an improvement to an ion implanter comprising a source of accelerated ions, a magnetic mass analyzer, one or more multipole magnetic lenses, an ion beam deceleration apparatus located downstream from said mass analyzer, and a means of mechanically scanning a workpiece through the resulting ion beam, either in a single direction or in a 2-dimensional raster pattern. The multipole lenses may be used to form either a ribbon-shaped beam of substantial uniform current density along its major dimension, which is orthogonal to said single direction in which the workpiece is scanned, or a smaller spot beam with a bell-shaped profile in the same direction. The deceleration apparatus comprises prism-shaped electrodes at different controlled potentials, which create transverse electric fields to deflect the beam along an s-shaped path while decelerating it, and causing the issuing desired beam to be centered on an intended axis, along which it travels a short distance before impinging on the scanned workpiece. The current density profile, and optionally the angular distribution of the ions, are measured by means of a traveling Faraday cup, or alternatively by an array of Faraday cups, or by equivalent means.

The improvement comprises providing at least one pair of movable electrodes symmetrically disposed about the beam, to which a controllable potential is applied, and of controlling the position and the potential of the electrodes to enhance the beam shape: in the case of a ribbon beam, to minimize the non-uniformity, and in the case of a spot beam, to enhance the conformance to a smooth bell-shape. In most instances the improvement is obtained by minimizing the generation of electric field components aligned with the major transverse dimension of the ion beam.

BRIEF DESCRIPTION OF THE DRAWINGS

FIG. 1 illustrates a cross section through the midplane of a prior art implanter system utilizing a chicane deceleration system, to which the present invention may be applied.

DETAILED DESCRIPTION OF THE INVENTION

Although disclosed embodiments use the terminology "deceleration" and the apparatus is named as "deceleration apparatus", the invention can also be used in acceleration situations. The invention concerns apparatus which filters the neutral particles and other contaminants away from the ion beam while accelerating or decelerating the beam.

In this proposed approach, the ion beam is decelerated downstream from the mass analyzer, and downstream from a multipole magnet assembly capable of collimating and further modifying the ion beam (such as controlling the beam shape, size, or uniformity). Concurrent with deceleration, the ion beam is bent in an s-shaped path to filter out the undesired neutral particles, even the undesired charged particles with improper charge-to-mass ratio(s).

Figure 3:
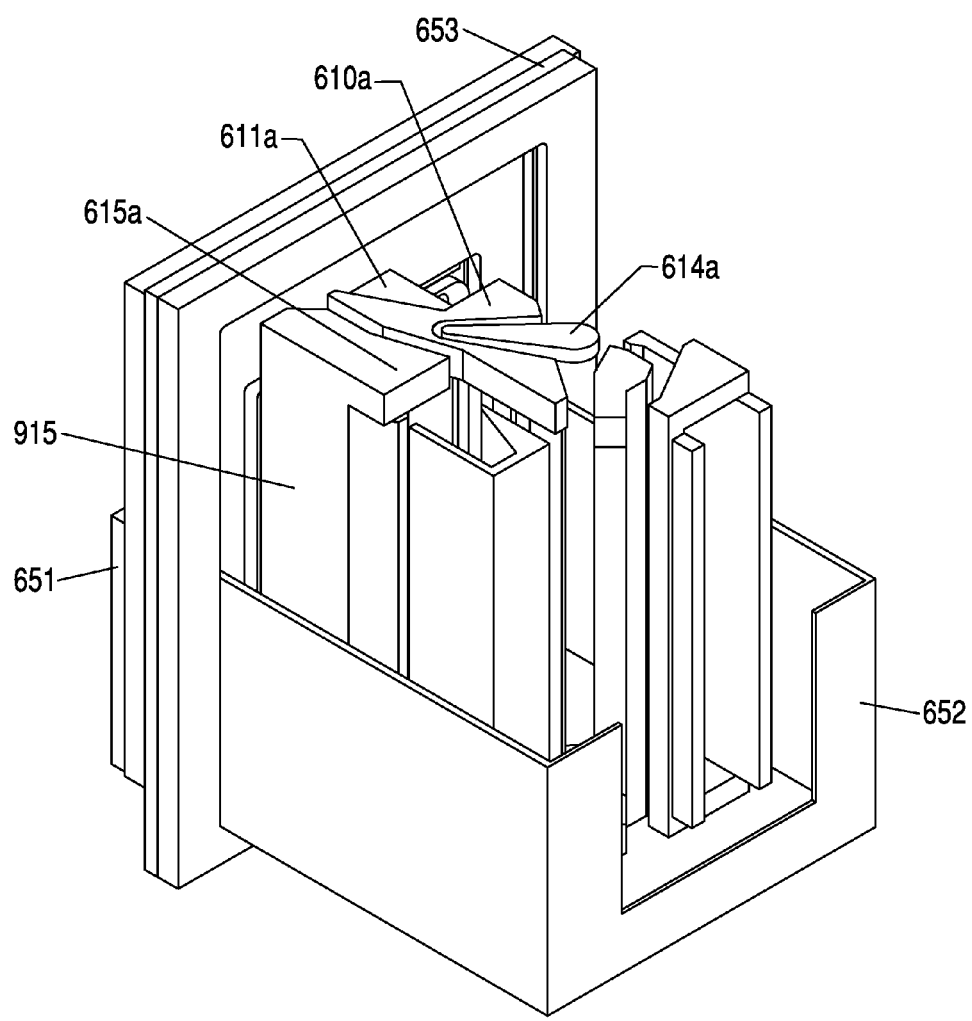
FIG. 3 shows a partially cutaway perspective view of a chicane deceleration system incorporating improvements according to the present invention.

It will be convenient to define a coordinate frame in which to describe the invention. Let the z-axis be the direction of travel of a central reference trajectory in the ion beam. This axis may be curvilinear, following the beam path, and curvilinear axes have special properties which will be mentioned when appropriate. The x- and y-axes are transverse to the beam direction. The x-axis lies in the direction of the minor dimension of the ribbon beam, and the y-axis is the direction of the major dimension, as shown in FIG. 3.

Figure 2A:
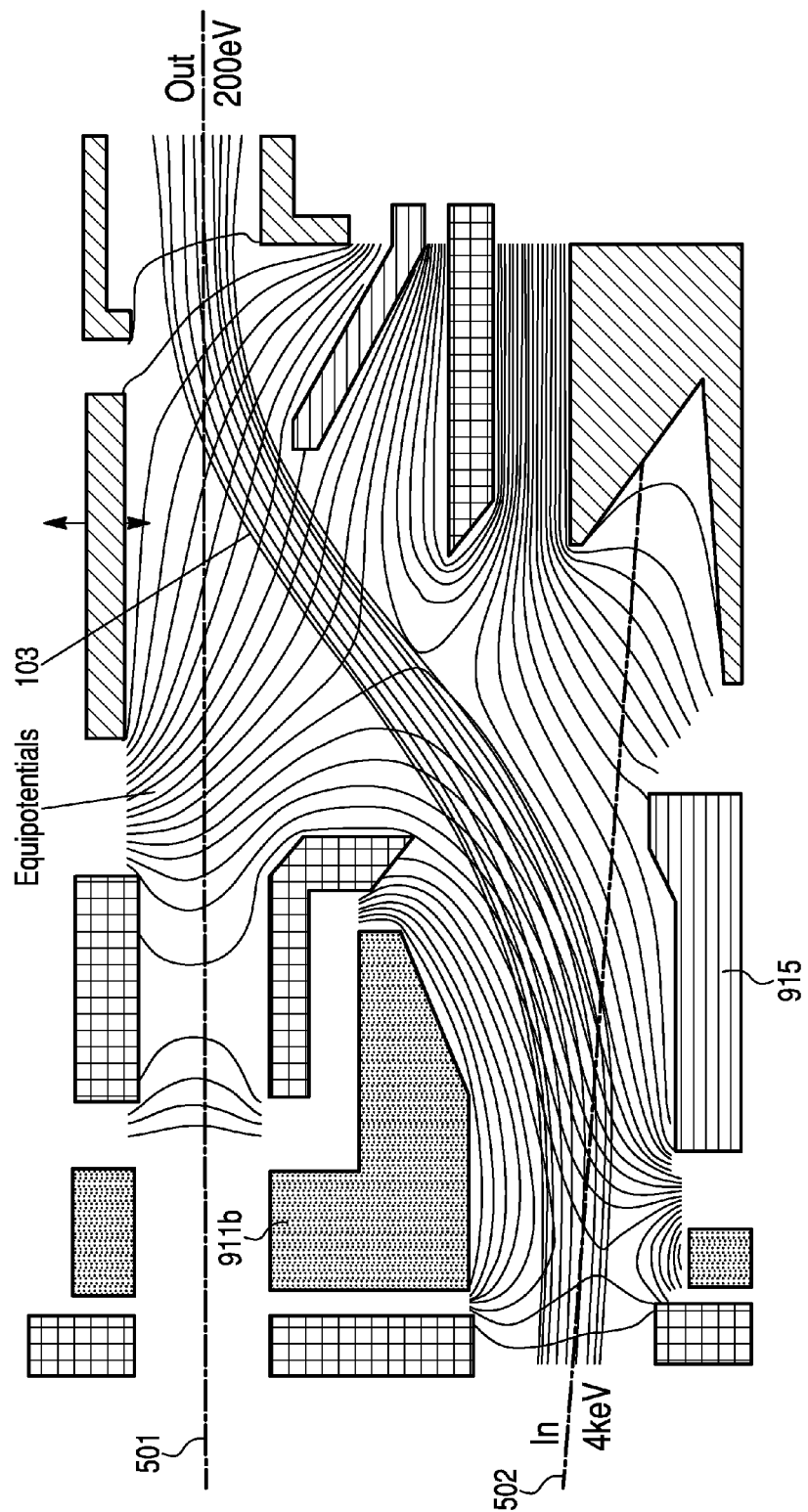
FIG. 2*a* is a section through the midplane of a prior art chicane deceleration system.

FIG. 2*a* illustrates midplane cross section, in the z-x plane, of a prior art deceleration apparatus capable of filtering out neutral particles downstream of a mass analyzer. It comprises a straight-through path 501 which can be utilized when deceleration is not required, and an s-shaped path 502 utilized for deceleration. Equipotential lines in the figure illustrate how the deflection and deceleration are combined. The electrodes shown in section are extruded in the direction orthogonal to the page. The beam is ribbon shaped and has a height of approximately 340 mm, suitable for implanting 300 mm wafers with some overscan.

Figure 2B:
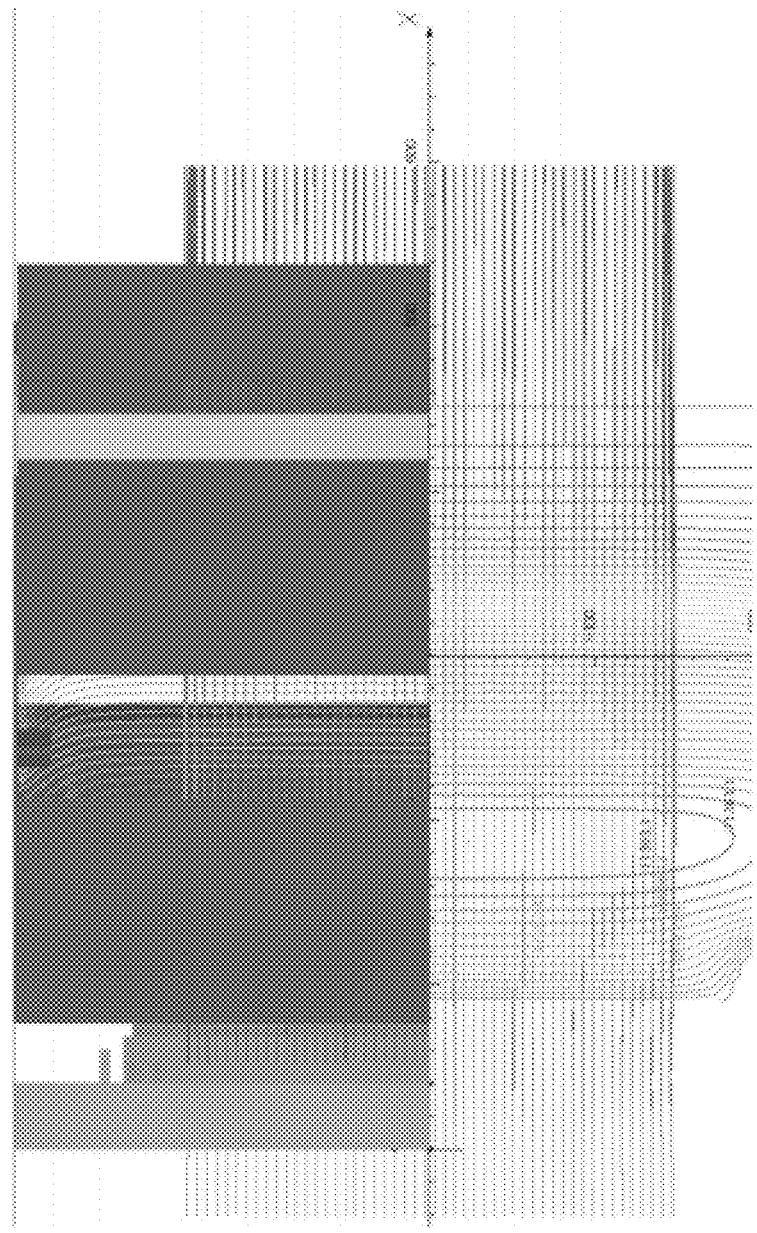
FIG. 2*b* is a side view of a prior art chicane deceleration system showing ion trajectories of a ribbon beam, and showing equipotential lines.
Figure 4:
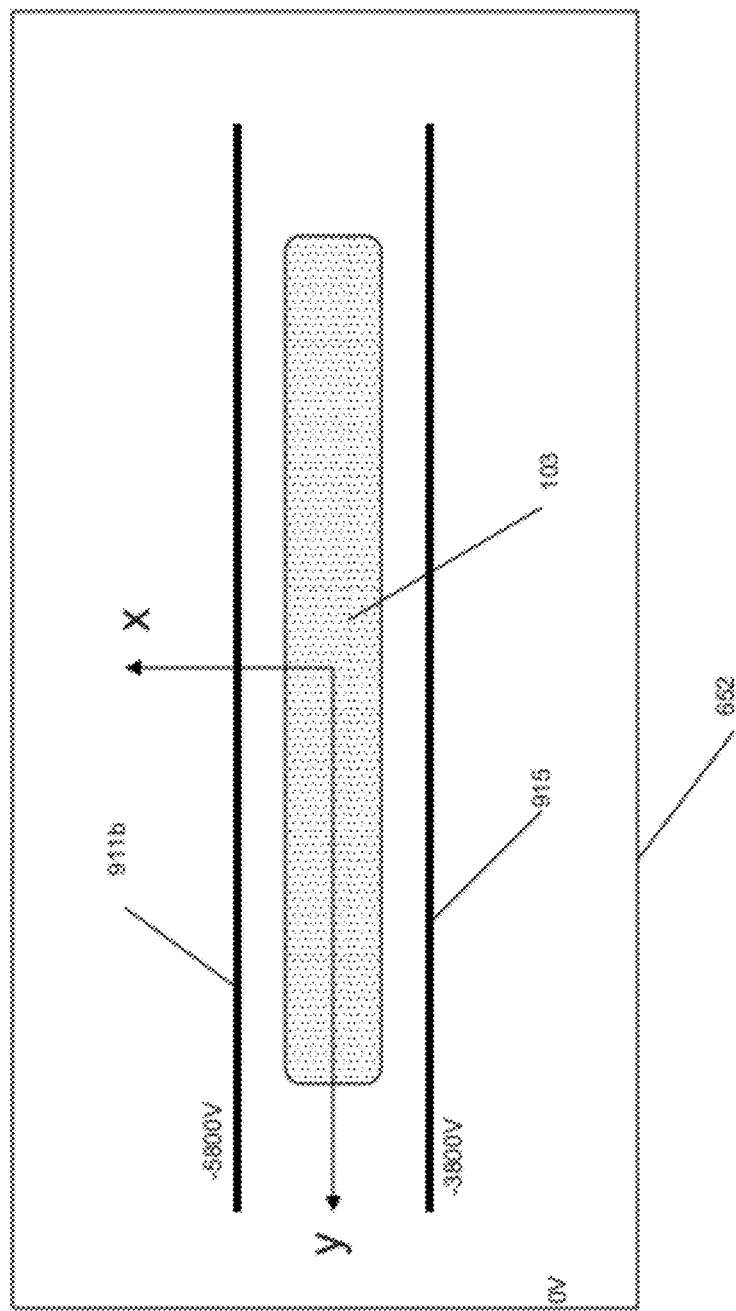
FIG. 4 shows a section through a low-current ribbon ion beam passing between electrodes between which a deflecting potential is applied, with the beam perturbed by the proximity to the ends of the electrodes and to a grounded chamber wall.

FIG. 2*b* illustrates a side view of the same apparatus. This view is at times looking in the x-direction of the beam as it leaves the apparatus, and shows the equipotentials in or near the y-z surface. Because the beam is bent, the x-direction is not a uniquely defined direction. Note that the electrodes extend only a short way beyond the beam edges in the y-direction. The electrodes are mounted in vacuum in a 2-part chamber comprising a first section 651 at a first potential (in this instance −3800V) and a second section 652 at a second potential, for convenience 0V. These are linked by an insulating bushing 653. Since the electrodes extend only a finite distance beyond the beam edges, and the chamber walls are moderately close to the electrode ends, there is some disturbance to the potential distribution at the ends of the electrodes, and this adversely affects the direction of ion trajectories near the top and bottom of the beam. Note that equipotential lines in the figure are curved near the top and bottom, and this demonstrates that electric field components are present which tend to deflect the ions towards or away from the axis, which is highly undesirable, since it disturbs the uniformity of the beam and alters its size. FIG. 4 is a cross section view through the beam, and while this view cannot show the defocusing component of the field, it clearly shows the causes of field distortion at the electrode ends. Note the proximity of ion beam 103 to the electrode ends.

Figure 5:
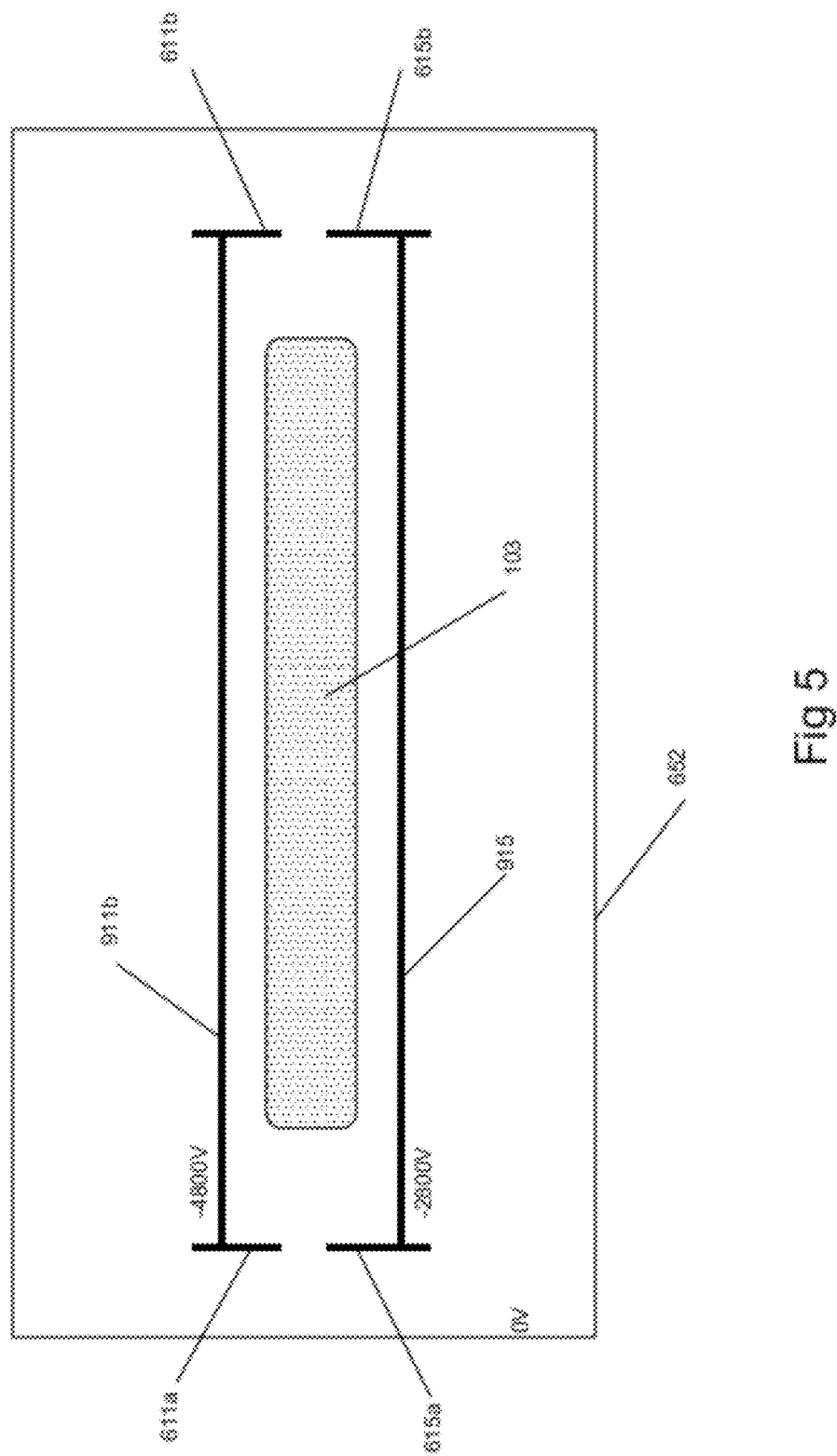
FIG. 5 shows a similar arrangement to FIG. 4, but caps are added to the electrode ends to shield the beam from the external wall potential.

If the beam is of sufficiently low current, the effects of space-charge are negligible compared with the applied electric fields. Under these conditions, the distortion of the electric field caused by the finite electrode length and proximity of chamber wall potentials can be mitigated by designing suitable terminating electrodes. In accordance with this invention, FIG. 5 shows a set of electrodes terminated by caps and supplementary electrodes. The potential distribution between the electrodes near the caps, and thus the fields, more closely approaches that at the symmetry plane.

However, this is not sufficient to transmit uniform ribbon beams at higher currents, where space-charge forces are more significant. Poisson's equation is $$\nabla^2 V = -\frac{\rho}{\epsilon_0},$$

and in Cartesian coordinates this can be written $$\frac{\partial}{\partial x}Ex + \frac{\partial}{\partial y} + \frac{\partial}{\partial z} = \frac{-\rho}{4\pi\epsilon_0} \quad (1)$$

From this it can be seen that a uniform current density ρ can give rise to linearly varying electric fields, and a possible solution would be:

$$E_x = \frac{-\rho}{4\pi\epsilon_0} + \text{const} \quad (2)$$
$$E_y = 0$$
$$E_z = \text{const}$$

This is the most desirable solution. $E_z$ represents the deceleration field, Ex represents the space-charge defocusing force added to the deflecting force applied by the voltages on the electrodes, and $E_y$ is zero. Note that the space-charge force is partially offset in the x-direction by a geometric focusing effect arising from the curvilinear z-axis, plus a further focusing effect caused by the applied field modulating the energy of off-axis ions; these two focusing forces do not appear as an electric field component. For further explanation see Banford, The Transport of Charge Particle Beams, SPON, 1966.

Figure 7:
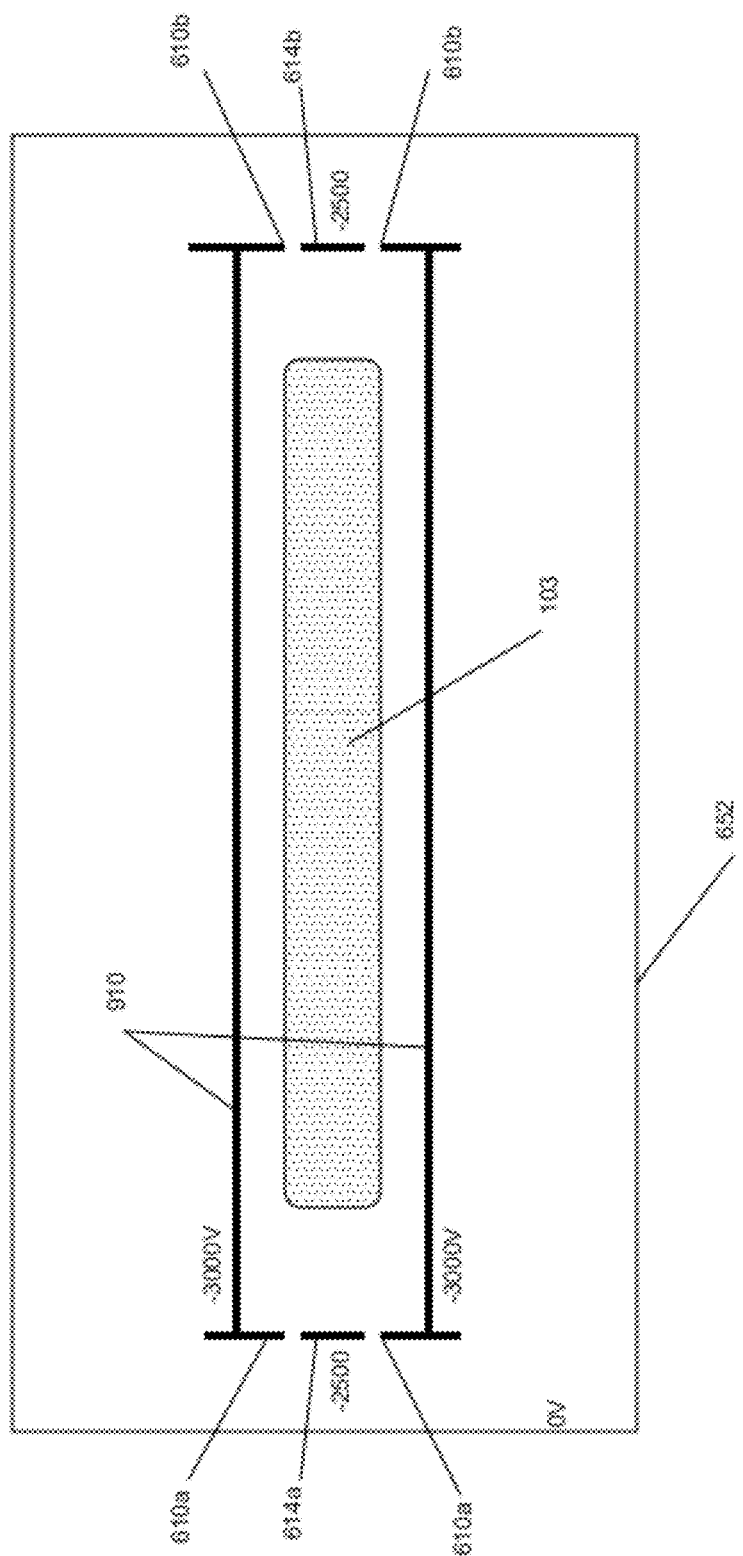
FIG. 7 shows a cross section at a point downstream from FIG. 6, where the beam is passing between a first pair of electrodes at the same potential, while being decelerated, and an additional pair of electrodes is provided in the middle of the gap at each end of the first pair of electrodes, at a voltage positive with respect to the first electrodes. In this figure, the ion beam is at a higher current, and contributes sufficient space-charge to significantly perturb the electric field.
Figure 11:
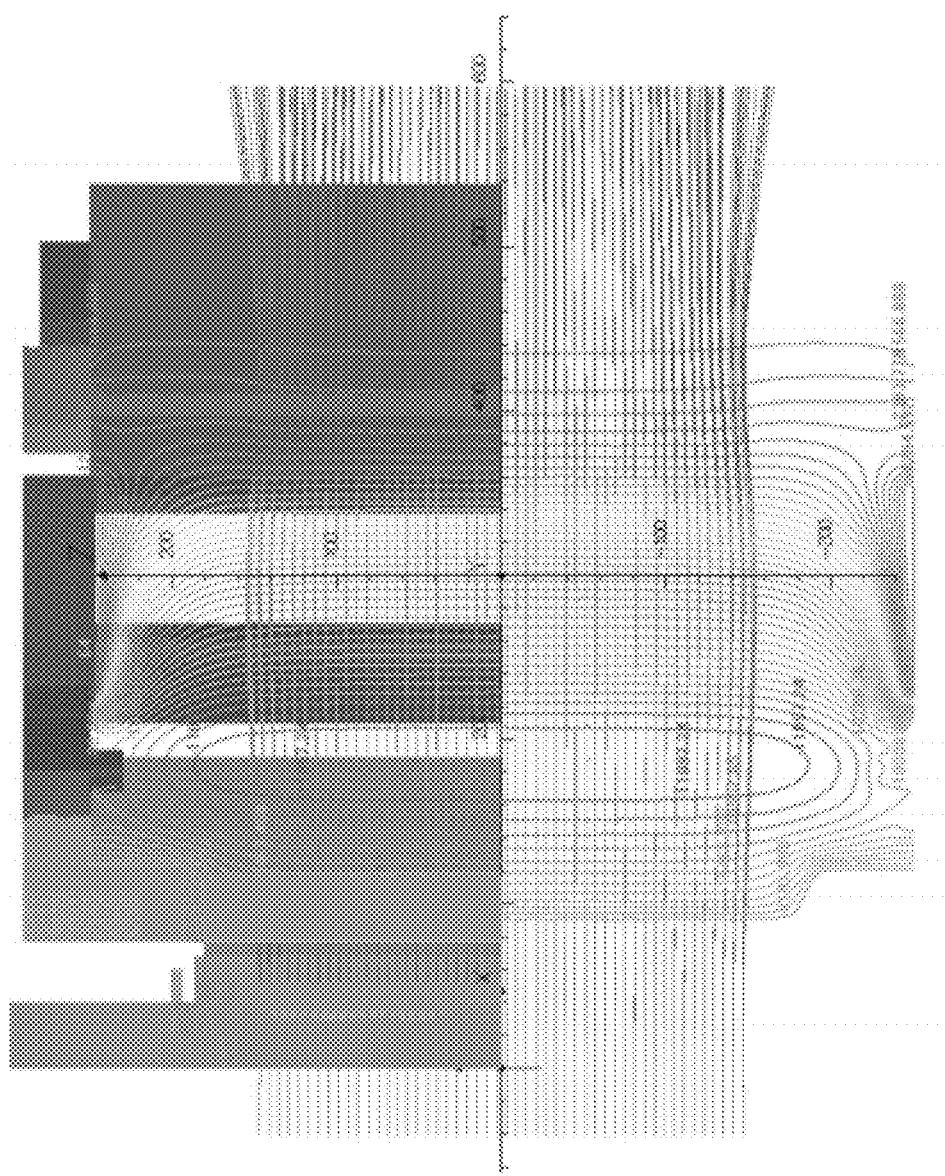
FIG. 11 shows a side view of the present invention with the potentials on the electrodes optimized to substantially compensate the space-charge effects shown in FIG. 4.
Figure 12A:
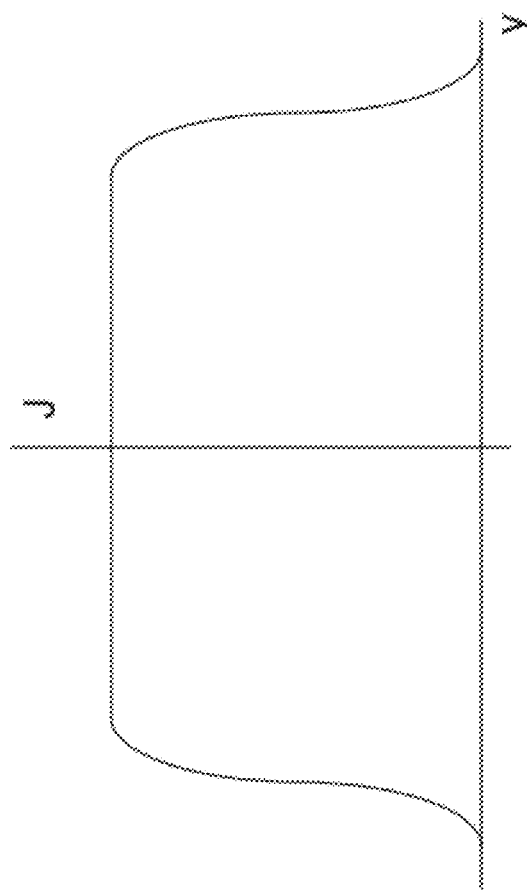
FIG. 12*a* shows a desired uniform ribbon ion beam current density profile, suitable for implanting with a 1-dimensional mechanical scan of the workpiece through the ion beam.
Figure 12B:
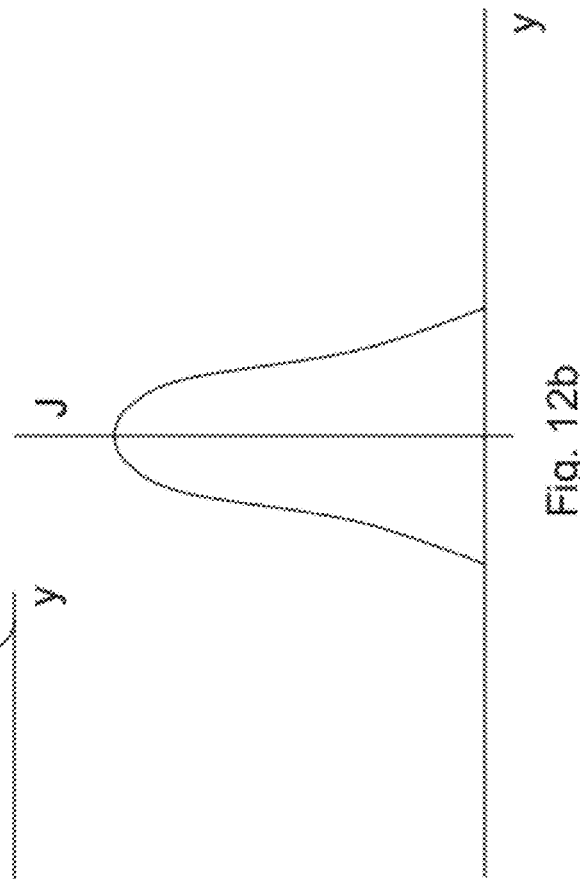
FIG. 12*b* shows a desired smooth bell-shaped spot ion beam profile, suitable for implanting with a 2D raster scan of the workpiece.

Thus solutions to Poisson's equation like equation 2 exist for this system, in which Ey is zero throughout the beam, or nearly so, and the present invention provides a means to realize these. The potential at the center of an ion beam with significant space-charge ρ is positive compared with that of a low-current beam. Therefore the equipotentials within the beam in the chicane deceleration system illustrated in FIG. 2b are shifted to the left, within the beam, by the presence of space-charge. The invention provides a means of similarly shifting those parts of the equipotentials outside the beam but adjacent to it, so as to remove or at least greatly reduce the curvature of the equipotentials at the edge of the beam, so as to satisfy equation (2). This is achieved by moving electrodes 614a and 614b to a position close to the edge of the ion beam and modifying its potential appropriately positive. The solution to position and potential is not exact, and is optimized empirically by measuring the uniformity of the ion beam at a downstream location by means of a traveling Faraday cup or equivalent (not shown). FIG. 11 shows the beneficial effect on these equipotentials, while FIG. 7 shows a cross section illustrating how this is accomplished.

It will be readily apparent that further small changes to the potential on the electrodes 614a and b will cause to outermost trajectories to change from slightly convergent to slightly divergent. Depending on the aspect ratio of the ribbon beam, this focusing/defocusing effect may be very local, or may extend significantly into the ion beam.

Figure 9:
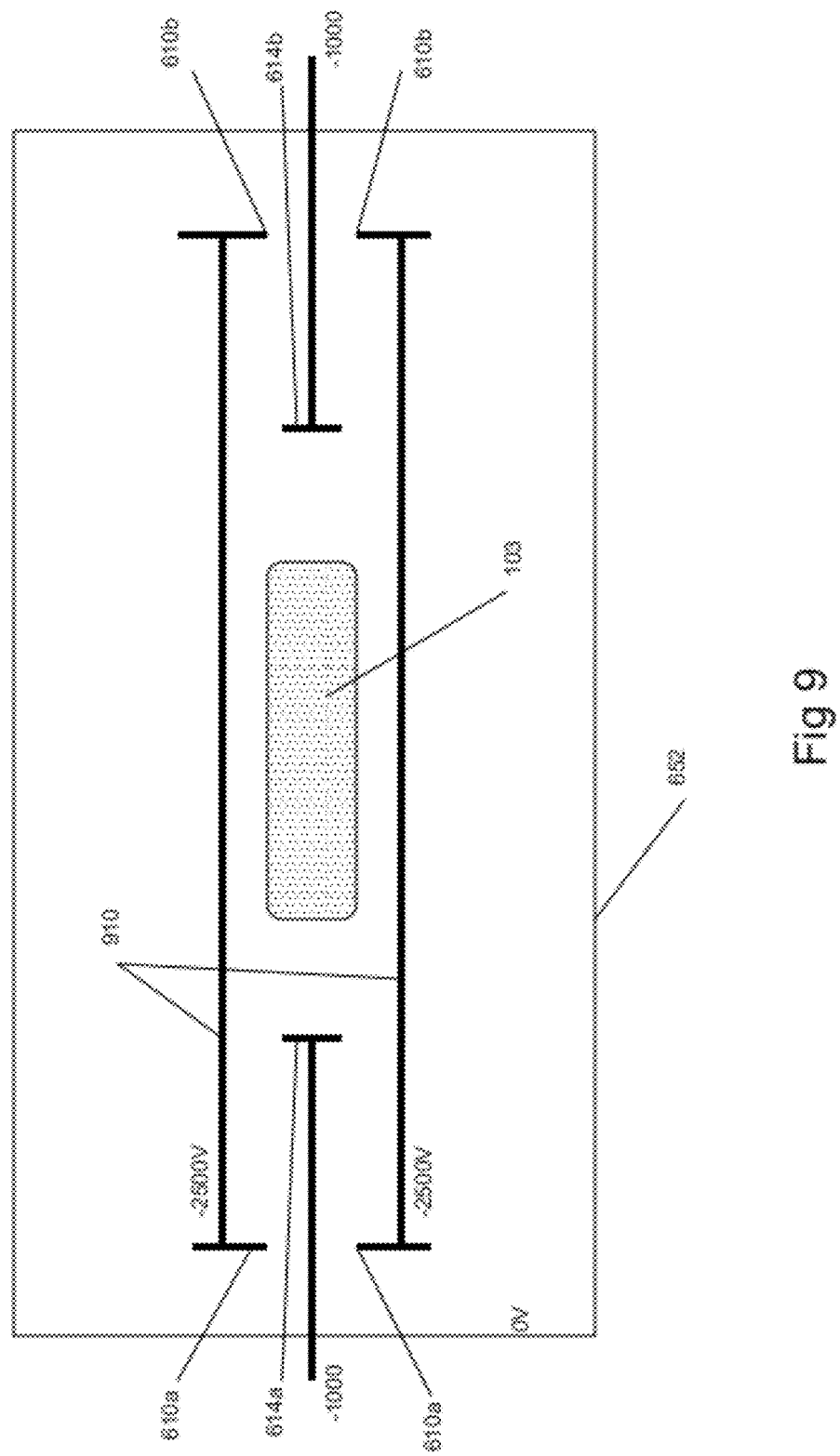
FIG. 9 shows a section similar to FIG. 7 in which a smaller high current beam is used, and the additional electrodes are adjusted in position to be close to the beam.

When the multipole lens 402 (FIG. 1) is used to focus the beam and generate a spot beam of greatly reduced height, the role of electrodes 614a and 614b is similar. They must be moved to a new position, as shown in FIG. 9, in order to be close enough to the ion beam, and since focusing the beam increases the space-charge density, the required potentials will be more positive.

Figure 6:
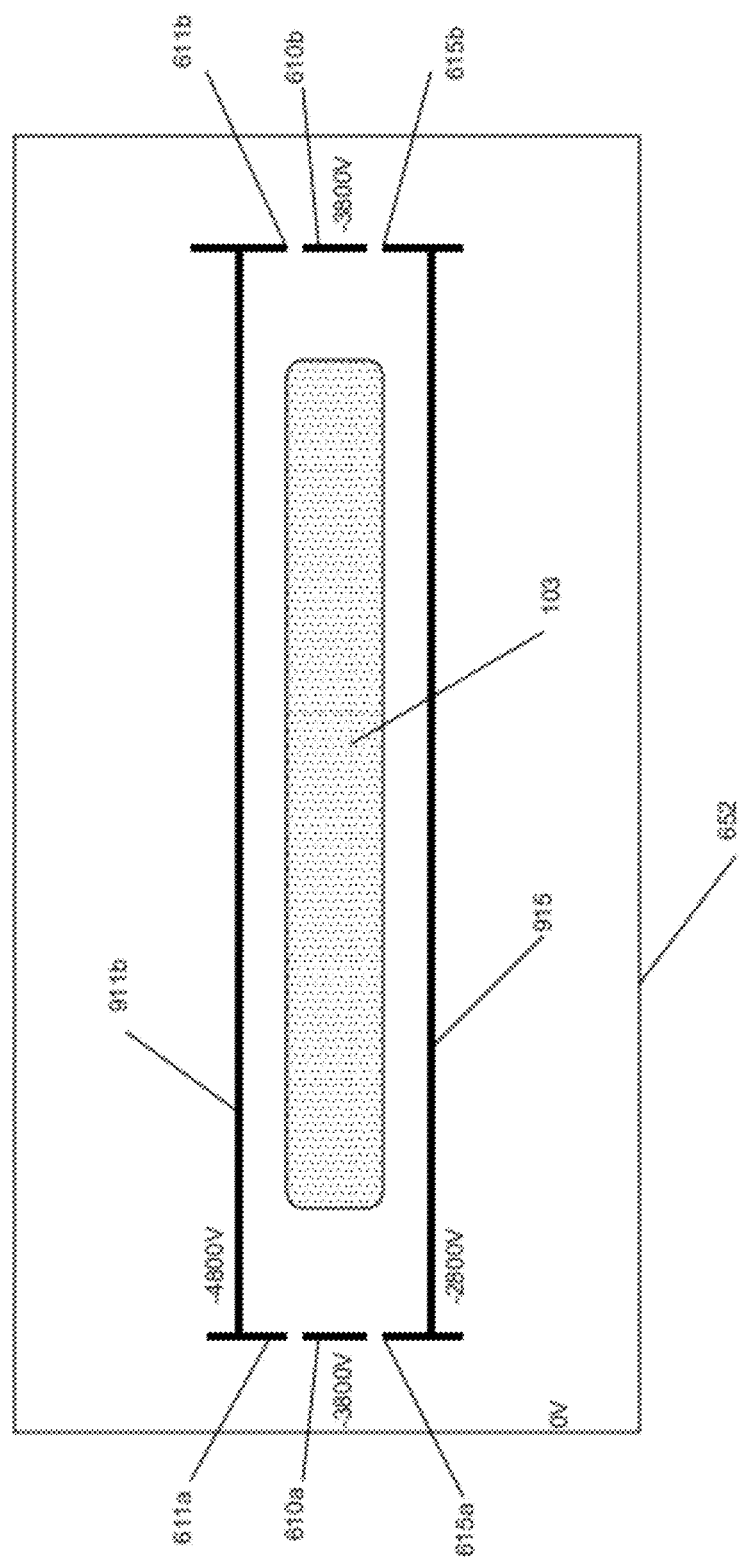
FIG. 6 shows a similar arrangement to FIG. 5, but with an additional pair of electrodes at a median potential placed between the caps, to improve the uniformity of the deflecting field near the beam edges.
Figure 8:
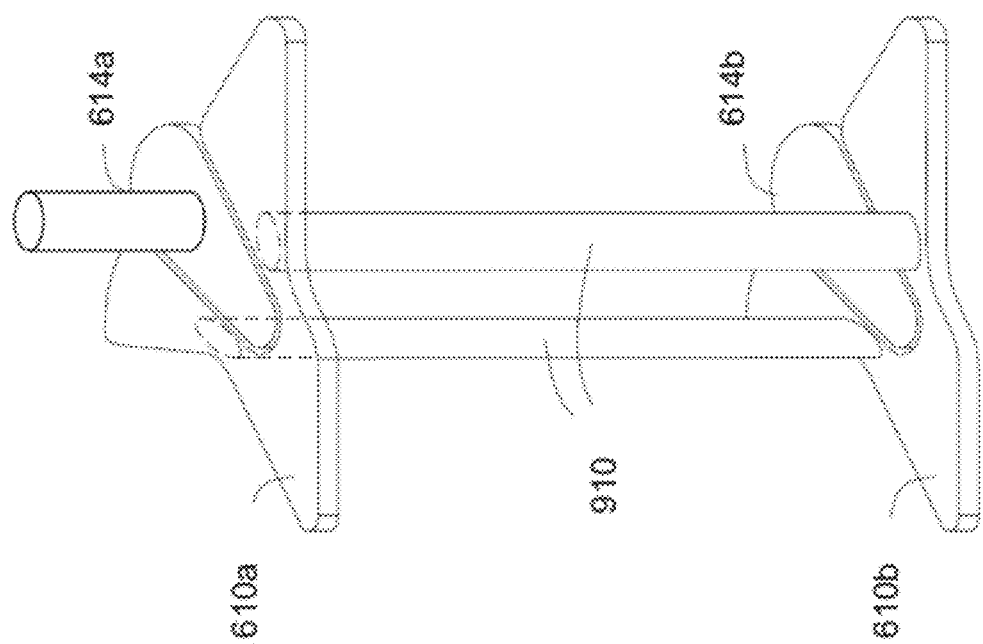
FIG. 8 shows a perspective view of a possible embodiment of the structure of FIG. 7.

In a preferred embodiment of the invention, illustrated in FIG. 3, all deflecting and/or decelerating electrodes in the deceleration assembly extend further in the y-direction than the maximum extent of the beam. The maximum height of the beam is targeted to be 340 mm, to allow a comfortable overscan margin for implanting a uniform dose into 300 mm diameter silicon wafers. Thus a 'beam zone' is bounded by the path between the various electrodes (as in FIG. 2), and by a y-dimension which may be +/−170 mm in the case of a 340 mm ribbon beam, or a significantly smaller (for example +/−80 mm) in the case of a spot beam. The term 'beam zone' is used to define the zone in which the ion beam is intended to be confined, depending on circumstances. Thus the height of the electrodes needs to be at least 400 mm, and preferably about 500 mm or more. Cap electrodes are attached and connected to the ends of these electrodes, for example cap 615a is mounted on electrode 915 at its top end, and 615b (not shown) is similarly connected to its bottom end. These electrodes extend toward the surface x=0 (see FIG. 4 for definition), closing in the gap at top and bottom. This has the effect of electrostatically screening the interior zone from external potentials, attenuating their influence. However it also modifies the shape of the transverse electric field close to the cap electrodes, which is undesirable. The middle electrodes 910 are positioned near the point of inflection of the beam path, and are at the same potential, and consequently their cap electrodes 610a are conveniently joined. Furthermore, the potential on electrode 610a is selected to be approximately midway between the potentials on electrodes 915 and 911b. (Since 911b is concealed in FIG. 3, see FIG. 6 for a cross sectional view. In FIG. 3 it is below cap electrode 611a.) It is therefore beneficial to give 610a and 610b a sculpted shape extending towards chamber section 651, since this causes the electric field close to the caps to better approximate the field near the midplane. FIG. 6 and FIG. 7 are cross sections in which a slice through electrode 610a appears, and FIG. 8 shows a preferred embodiment of this electrode. FIG. 9 is a cross section in which the middle of electrode 610a is cut away, and part of movable electrode 614a occupies its place.

In general, the shapes of the cap electrodes are optimized using codes such as Cobham's OPERA, which solve Laplace's and Poisson's equations in 3 dimension, with the goal of rendering the equipotential lines vertical and straight within the beam zone (since this eliminates any unwanted $E_y$ electric field component) and additionally keeps the strength of $E_x$ as uniform as possible inside the beam zone. Laplace's equation is used in the limit of low beam currents, Poisson's equation when considering high current beams with significant space-charge. The detailed three-dimensional shapes determine the relative effect of the electrode potentials in the beam zone.

Electrodes 614a and 614b play a similar role to 610a and b, controlling both the strength of $E_x$ near the top and bottom of the beam zone, and modifying the shape of the equipotentials to keep them as straight as possible.

Figure 10:
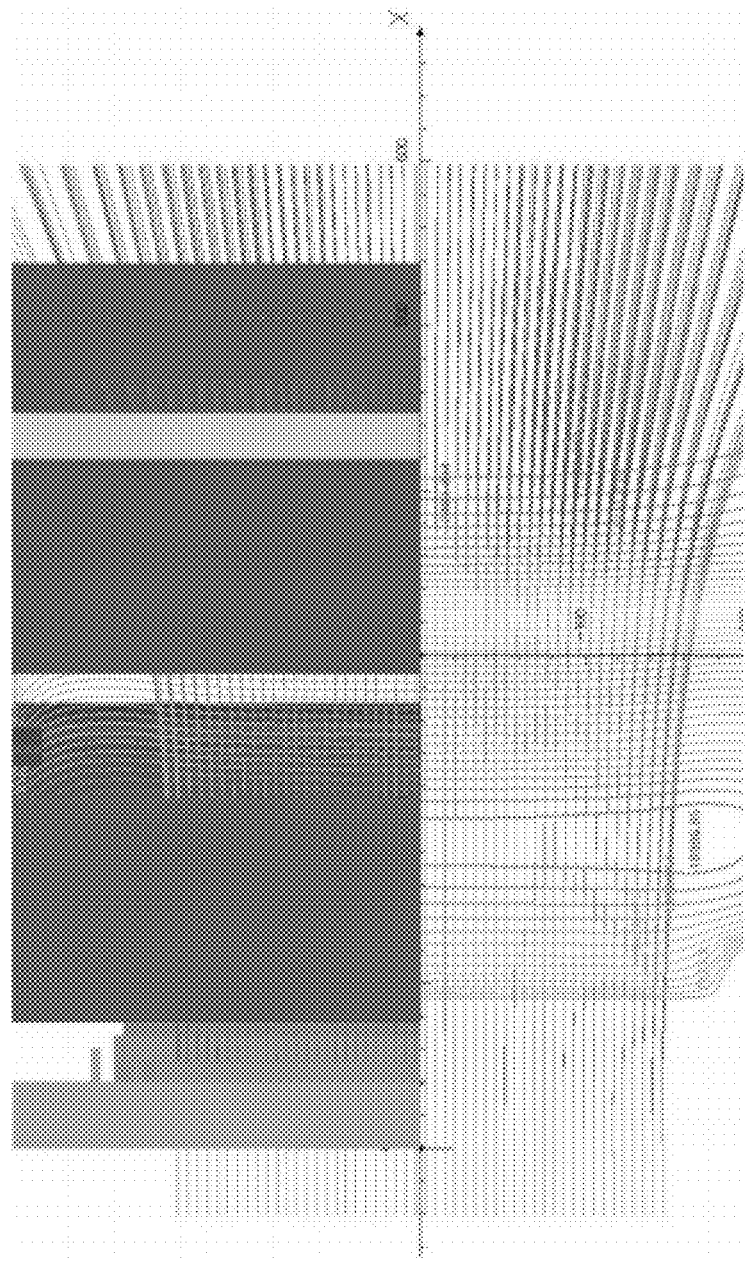
FIG. 10 shows a partially cutaway side view of the present apparatus, with a fairly high current beam being decelerated from 10 keV to 1.5 keV.

Now consider the effect of space-charge in the beam. As discussed above, its first effect is to push the center of the equipotential surfaces to the left in the figures, and this can be clearly seen in FIG. 10, for a high current beam. The equipotentials become curved, and the curvature will be greatest where the space-charge is highest, which generally will be where the beam energy is lowest. If a positive potential is now applied to electrodes 614a and 614b, the effect is to shift the equipotentials near these electrodes to the left, as shown in FIG. 11, which has the effect of reducing, or in some instances reversing, the curvature of the equipotentials. The effect on the beam can be seen: its divergence is reduced. In FIG. 10, a substantial fraction of the beam diverges at angles with magnitudes between 10 and 20 degrees; In FIG. 11, the divergence is reduced so that for most of the beam it is less than 1 degree, although a small section at the edge of the beam exceeds this limit. FIG. 7 illustrates this in cross section through the beam.

Clearly if the beam is now changed from a ribbon beam to a spot beam of about ⅓ the height, this approach must be modified. Electrodes 614a and b cannot fulfill the same role unless they are moved closer to the beam. To accomplish this, in this preferred embodiment, these electrodes are mounted on a controllable servomechanism to allow them to be moved closer to the ion beam, as shown in FIG. 9. In other embodiments additional electrodes are made movable, such as 610a and 610b.

Although specific embodiments have been illustrated and described, it will be appreciated by those skilled in the art that the present invention may be applied to a variety of situations in which charged particle beams are accelerated or decelerated. Thus although, for example, this invention was conceived as an enhancement to a deceleration system operating with an s-shaped beam path, many modifications to the beam path may be conceived, and which are intended to fall within the scope of the invention. In particular, the apparatus may be used in any orientation. The scope of the present invention is intended to be limited solely by the appended claims.

What is claimed is:

1. An electrode assembly for accelerating or decelerating an ion beam, the ion beam entering the electrode assembly at an initial beam direction and following an ion beam path through the electrode assembly, the electrode assembly comprising:
   a first set of electrodes configured to electrostatically deflect the ion beam a first amount with respect to a plane aligned with the initial beam direction and a dimension of a cross-section of the ion beam, the first set of electrodes comprising:
      a first pair of deflecting electrodes positioned parallel to the dimension of the cross-section of the ion beam; and
      a first set of electrode caps attached to opposite ends of each deflecting electrode of the first pair of deflecting electrodes, wherein the first set of electrode caps are positioned orthogonal to the dimension of the cross-section of the ion beam, and wherein the first set of electrode caps at least partially extend towards a centerline between the first pair of deflecting electrodes to shield a region between the first pair of deflecting electrodes from surrounding electric fields; and
   a second set of electrodes configured to electrostatically deflect the ion beam a second amount with respect to the plane, the second set of electrodes comprising:
      a second pair of deflecting electrodes positioned parallel to the dimension of the cross-section of the ion beam; and
      a second set of electrode caps attached to opposite ends of each deflecting electrode of the second pair of deflecting electrodes, wherein the second set of electrode caps are positioned orthogonal to the dimension of the cross-section of the ion beam, and wherein the second set of electrode caps at least partially extend towards a centerline between the second pair of deflecting electrodes to shield a region between the second pair of deflecting electrodes from surrounding electric fields.

2. The electrode assembly of claim 1, further comprising a set of auxiliary electrodes disposed between the first set of electrodes and the second set of electrodes, the set of auxiliary electrodes comprising a first pair of auxiliary electrodes positioned orthogonal to the dimension of the cross-section of the ion beam and disposed on opposite sides of the ion beam path to at least partially shield the ion beam path between the first set of electrodes and the second set of electrodes from surrounding electric fields.

3. The electrode assembly of claim 2, wherein at least one auxiliary electrode of the first pair of auxiliary electrodes is configured to translate in a direction parallel to the dimension of the cross-section of the ion beam, thereby increasing or decreasing a distance between the first pair of auxiliary electrodes.

4. The electrode assembly of claim 2, wherein the first pair of auxiliary electrodes has a width that is greater than a width of the ion beam.

5. The electrode assembly of claim 2, wherein the set of auxiliary electrodes further comprises:
   a second pair of auxiliary electrodes disposed on opposite sides of the ion beam path and positioned parallel to the dimension of the cross-section of the ion beam; and
   a pair of auxiliary electrode caps attached to opposite ends of the second pair of auxiliary electrodes, the pair of auxiliary electrode caps positioned orthogonal to the dimension of the cross-section of the ion beam.

6. The electrode assembly of claim 5, wherein each auxiliary electrode of the first pair of auxiliary electrodes is at least partially surrounded by an auxiliary electrode cap of the pair of auxiliary electrode caps.

7. The electrode assembly of claim 5, wherein the first pair of auxiliary electrodes is electrically isolated from the pair of auxiliary electrode caps.

8. The electrode assembly of claim 7, wherein the first pair of auxiliary electrodes is electrically isolated from the second pair of auxiliary electrodes.

9. The electrode assembly of claim 5, wherein at least one auxiliary electrode of the first pair of auxiliary electrodes is configured to translate between the second pair of auxiliary electrodes in a direction parallel to the dimension of the cross-section of the ion beam, thereby increasing or decreasing a distance between the first pair of auxiliary electrodes.

10. The electrode assembly of claim 5, wherein at least a portion of the pair of auxiliary electrode caps is positioned between the first set of electrode caps and on opposite sides of the region between the first pair of deflecting electrodes to at least partially shield the region between the first pair of deflecting electrodes from surrounding electric fields.

11. The electrode assembly of claim 5, wherein a first electrode of the first pair of deflecting electrodes has a first electric potential, a second electrode of the first pair of deflecting electrodes has a second electric potential, and the pair of auxiliary electrode caps has an electric potential approximately equal to a mean of the first electric potential and the second electric potential, and wherein the first electric potential is different from the second electric potential.

12. The electrode assembly of claim 2, wherein a first pair of electrode caps of the first set of electrode caps are attached to opposite ends of a first electrode of the first pair of deflecting electrodes and a second pair of electrode caps of the first set of electrode caps are attached to opposite ends of a second electrode of the first pair of deflecting electrodes, and wherein the first set of electrodes has a gap between the first pair of electrode caps of the first set of electrode caps and the second pair of electrode caps of the first set of electrode caps.

13. The electrode assembly of claim 2, wherein the first pair of auxiliary electrodes is electrically isolated from the first set of electrodes and the second set of electrodes.

14. The electrode assembly of claim 2, wherein the first pair of auxiliary electrodes is configured to receive a voltage from a voltage power supply.

* * * * *